United States Patent
Wang et al.

(10) Patent No.: US 9,774,297 B2
(45) Date of Patent: Sep. 26, 2017

(54) DOUBLE-BALANCED FIELD-EFFECT TRANSISTOR MIXER WITH DIRECT SINGLE-ENDED INTERMEDIATE FREQUENCY OUTPUTS

(71) Applicant: Linear Technology Corporation, Milpitas, CA (US)

(72) Inventors: Xudong Wang, Colorado Springs, CO (US); Thomas E. Schiltz, Colorado Springs, CO (US); William B. Beckwith, Monument, CO (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 15/158,339

(22) Filed: May 18, 2016

(65) Prior Publication Data

US 2017/0141730 A1    May 18, 2017

Related U.S. Application Data

(60) Provisional application No. 62/255,043, filed on Nov. 13, 2015.

(51) Int. Cl.
*G06F 7/44* (2006.01)
*H03D 7/14* (2006.01)
*H03H 11/32* (2006.01)

(52) U.S. Cl.
CPC ......... *H03D 7/1458* (2013.01); *H03D 7/1441* (2013.01); *H03H 11/32* (2013.01)

(58) Field of Classification Search
CPC ..... H03D 7/1458; H03D 7/1441; H03H 11/32
See application file for complete search history.

(56) References Cited

U.S. PATENT DOCUMENTS

| 6,850,746 | B1 * | 2/2005 | Lloyd | H04B 1/28 |
| | | | | 455/272 |
| 6,957,055 | B2 | 10/2005 | Gamliel | |
| 8,446,205 | B2 * | 5/2013 | Sakamoto | H03D 7/1441 |
| | | | | 327/356 |
| 8,558,605 | B1 * | 10/2013 | Wang | H03D 7/1441 |
| | | | | 327/355 |
| 9,312,815 | B2 | 4/2016 | Wang et al. | |

* cited by examiner

*Primary Examiner* — Kenneth B Wells
(74) *Attorney, Agent, or Firm* — VLP Law Group LLP; Edward Kwok (57) ABSTRACT

A double-balanced FET mixer may include: single-ended RF port that receives or delivers single-ended RF signal; RF balun that converts the received single-ended RF signal into differential RF signal or generates delivered single-ended RF signal from received differential RF signal; local oscillator input port receives local oscillator signal; direct IF port receives or delivers an IF signal; and at least two FETs process the local oscillator signal and generate or process the differential RF signal and IF signal. The mixer may have no IF balun separate and distinct from tRF balun; may receive an input signal at RF port and generates output signal at IF port. The mixer may receive input signal at IF port and generate an output signal at the RF port, the output signal in either case being plus or minus the local oscillator signal. The double-balanced FET mixer may operate with IF frequencies down to DC.

15 Claims, 8 Drawing Sheets

DOUBLE-BALANCED FIELD-EFFECT TRANSISTOR MIXER WITH DIRECT SINGLE-ENDED INTERMEDIATE FREQUENCY OUTPUTS

CROSS REFERENCE TO RELATED APPLICATIONS

The present application relates to and claims priority of U.S. provisional patent application ("Provisional Application"), Ser. No. 62/255,043, filed Nov. 13, 2015, entitled "DOUBLE BALANCED FET MIXER WITH DIRECT SINGLE-ENDED IF PROVIDING HIGH LINEARITY AND HIGH ISOLATION." The disclosure of the Provisional Application is hereby incorporated by reference in its entirety.

BACKGROUND OF THE INVENTION

1. Field of the Invention

This disclosure relates to radio frequency (RF), microwave and millimeter systems, and more particularly, to circuit topologies for frequency mixers that can be used in such systems.

2. Description of the Related Art

Figure 1:
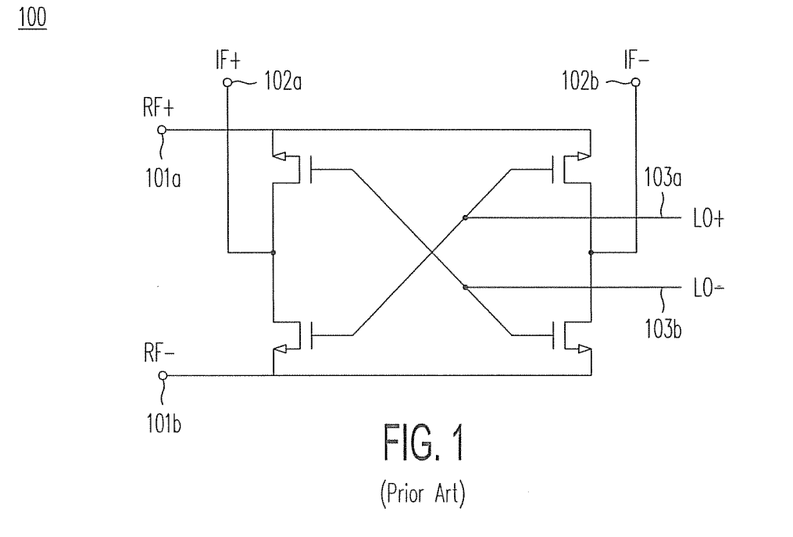
FIG. 1 shows a conventional switching or commutating mixer 100, also known as a double-balanced field-effect transistor (FET) mixer.

Frequency mixers—i.e., circuits that convert a signal modulated at one frequency to a signal modulated at another frequency—may be critical circuit components in certain wireless communication systems, such as RF, microwave and millimeter-wave systems. FIG. 1 shows a conventional switching or commutating mixer 100, also known as a double-balanced field-effect transistor (FET) mixer. Switching or commutating mixer 100 is also called a passive mixer, as 0 Hz ("DC") bias or quiescent current does not flow through the FETs in the mixer. Double-balanced FET mixer 100 of FIG. 1 can provide both frequency up-conversion and frequency down-conversion. Of the two input and output signals at the mixer's input port and output port, across terminals 101a and 101b and across terminals 102a and 102b, respectively, the higher frequency signal is usually referred to as the RF signal, while the lower frequency signal is usually referred to as the intermediate frequency (IF) signal. In FIG. 1, the RF signal and the IF signal may each be a differential signal. Differential local oscillator (LO) provides a differential oscillator signal across terminals 103a and 103b at the LO frequency to control the frequency conversion performed by mixer 100.

Figure 2:
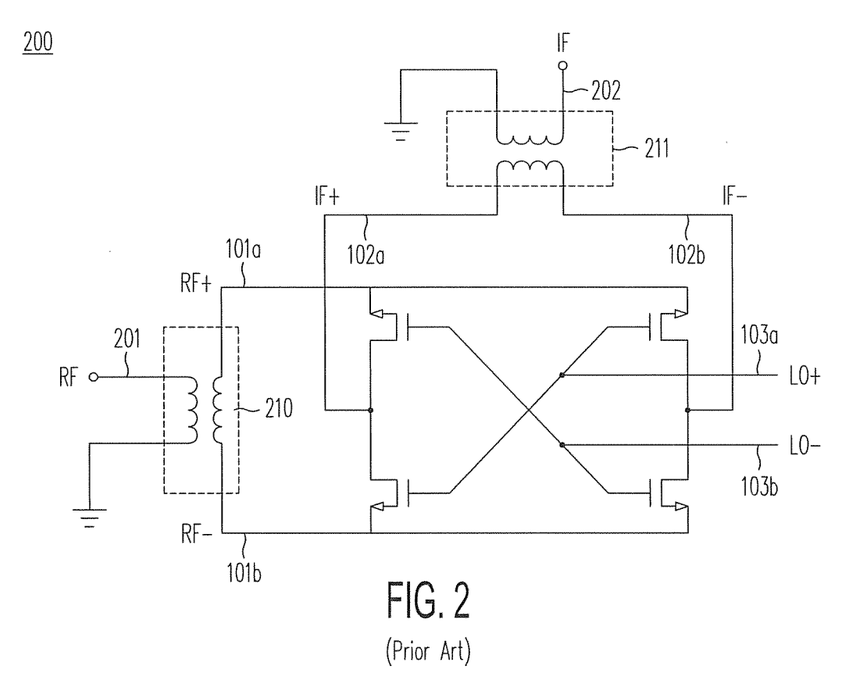
FIG. 2 shows a conventional double-balanced FET mixer 200 with single-ended RF and IF signals provided at input port 201 and output port 202.

For many frequency mixing applications, input and output signals that are single-ended are preferred over differential signals. FIG. 2 shows conventional double-balanced FET mixer 200 with RF and IF signals (provided at input port 201 and output port 202, respectively) that are single-ended. The RF signal and the IF signal can each be converted to a differential signal using a balun (e.g., balun 210 or balun 211, as shown in FIG. 2). The operating frequency range of mixer 200 of FIG. 2 may be limited by the bandwidths of baluns 210 and 211. For a FET mixer with integrated baluns, the size of each integrated balun may be limited by the chip area, which may restrict the IF balun operation to frequencies above a few hundred megahertz. There are many applications, however, that require the mixer to operate at lower IF frequencies, even down to DC. For example, when used as a phase-detector, an IF output signal that is modulated down to DC may be required.

Figure 3:
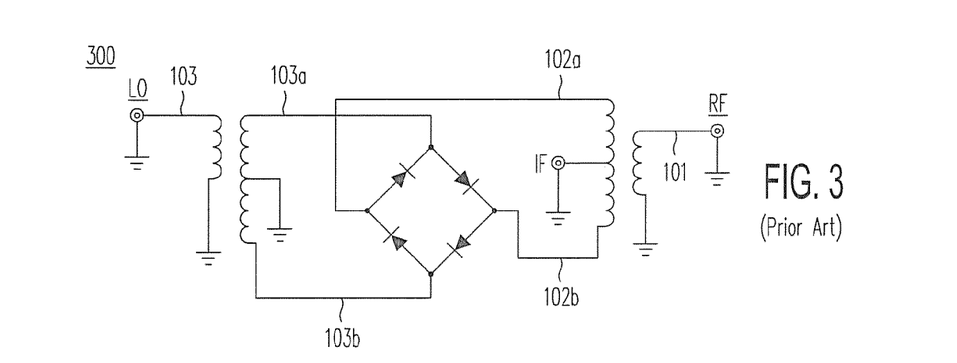
FIG. 3 shows conventional double-balanced diode mixer 300 that has an IF frequency response that reaches down to DC.

FIG. 3 shows a conventional double-balanced diode mixer 300 that has an IF frequency response that reaches down to DC. While double-balanced diode mixers can achieve IF frequencies down to DC, double-balanced FET mixers are generally preferred. This is because double-balanced FET mixers are easier to integrate onto a monolithic semiconductor die. Furthermore, double-balanced FET mixers may offer better impedance-matching over wide ranges of bandwidths, higher isolation, and lower local oscillator power demands than double-balanced diode mixers. Designing a double-balanced FET mixer with a single-ended IF terminal is, however, challenging.

Figure 4:
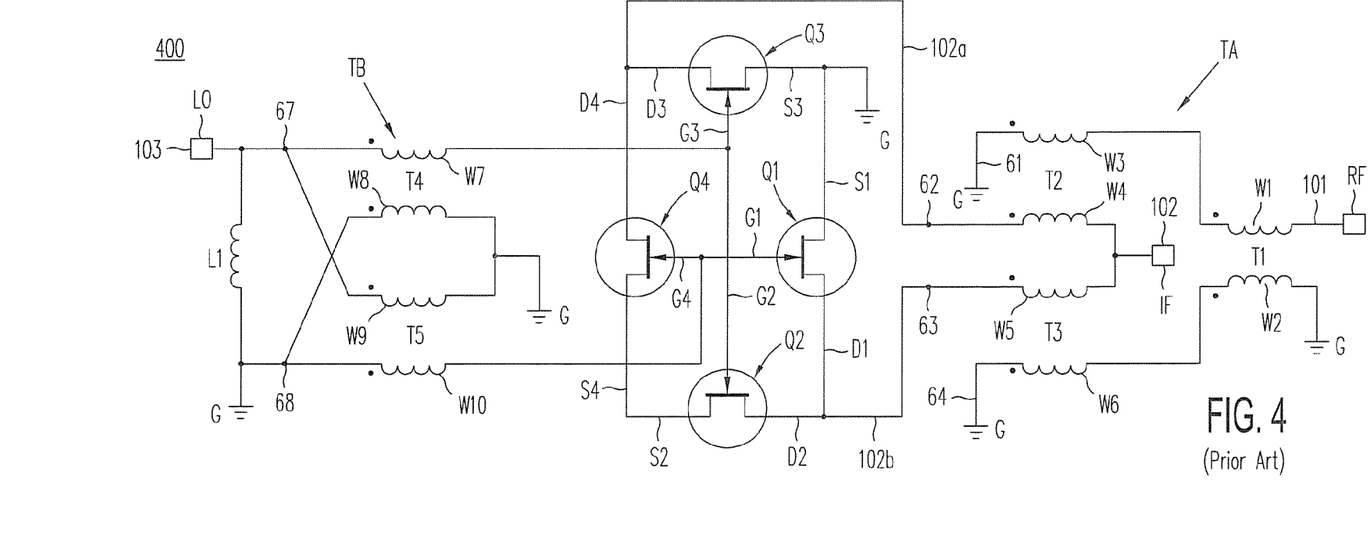
FIG. 4 shows conventional double-balanced FET mixer 400 with an IF frequency response that reaches down to DC.

FIG. 4 shows conventional double-balanced FET mixer 400 with an IF frequency response that reaches down to DC. In FIG. 4, the IF signal path through the IF transformers T2 and T3 may allow for a low IF frequency capability. (See, e.g., U.S. Pat. No. 6,957,055, entitled "Double Balanced FET Mixer with High IP3 and IF response Down to DC levels" to D. Gamliel.) The parasitic reactances of transformers T2 and T3, however, may adversely affect both the impedance-matching and the high frequency performance of IF port 102. Also, the conversion gain of double-balanced FET mixer 400 may be degraded by the RF signal loss through these transformers.

SUMMARY

According to one embodiment of the present invention, a double-balanced FET mixer may include: (i) a single-ended RF port that receives or delivers a single-ended RF signal; (ii) an RF balun that converts the received single-ended RF signal into a differential RF signal or that generates the delivered single-ended RF signal from a received differential RF signal; (iii) a local oscillator input port that receives a local oscillator signal; (iv) a direct IF port that receives or delivers an IF signal; and (v) at least two FETs that process the local oscillator signal and that generate or process the differential RF signal and IF signal. The double-balanced FET mixer need not have an IF balun that is separate and distinct from the RF balun. The double-balanced FET mixer may receive an input signal at the RF port and may generate an output signal at the IF port, or it may receive an input signal at the IF port and may generate an output signal at the RF port. In either case, the output signal has a frequency that is the frequency of the received signal plus or minus the local oscillator signal. The double-balanced FET mixer may operate with an IF frequency that is down to DC.

According to one embodiment of the present invention, a double-balanced FET mixer may include: (i) a single-ended RF port that receives or delivers a single-ended RF signal; (ii) an RF balun that converts the received single-ended RF signal into a differential RF signal or that generates the delivered single-ended RF signal from a received differential RF signal; (iii) a local oscillator input port that receives a local oscillator signal; (iv) a direct IF port that receives or delivers an IF signal; and (v) at least a first FET and a second FET that have drain terminals connected to one another, source terminals connected to the RF balun, and gate terminals that are connected to the local oscillator signal. The double-balanced FET mixer need not have an IF balun that is separate and distinct from the RF balun.

In some embodiments, the double-balanced FET mixer may include two additional FETs that have drain terminals connected to one another, source terminals connected to the RF balun, and gate terminals connected to the local oscillator signal. The RF balun may be a wideband RF balun.

In some embodiments, the local oscillator signal may be a single-ended signal and the double-balanced FET mixer may include a local oscillator balun receiving the local oscillator signal. The double-balanced mixer may include a buffer that is connected to the local oscillator balun. Alternatively, the local oscillator signal may be a differential signal.

According to one embodiment of the present invention, a triple-balanced mixer, an IQ mixer, an image reject mixer, or a single side band (SSB) mixer may include at least two of any of the double-balanced FET mixers of the present invention described above.

According to one embodiment of the present invention, a double-balanced FET mixer may include: (i) a single-ended RF port that receives or delivers a single-ended RF signal; (ii) an RF balun that converts the received single-ended RF signal into a differential RF signal or generates the delivered single-ended RF signal from a received differential RF signal; (iii) a local oscillator input port that receives a local oscillator signal; (iv) a direct IF port that receives or delivers an IF signal; and (v) at least first, second, third, and fourth FETs. In that double-balanced FET mixer, the drain terminals of the first and the second FETs may be connected to a ground reference, the drain terminals of the second and third FETs may be connected together and not to any other node, and the source terminals of the first and third FETs may be connected together and to one of the differential RF signals. Furthermore, in that double-balanced FET mixer, the sources of the second and fourth FETs may be connected together and to a different one of the differential RF signals, the gate terminals of the first, second, third, and fourth FETs may be connected to the local oscillator signal, and the direct IF port may be connected to a center tap on the RF balun. The double-balanced FET mixer need not have an IF balun that is separate and distinct from the RF balun.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Innovative topologies for double-balanced FET mixers are now described. Each of these double-balanced FET mixers provides a direct IF output, which may allow IF frequencies down to DC without requiring an IF balun.

Figure 5:
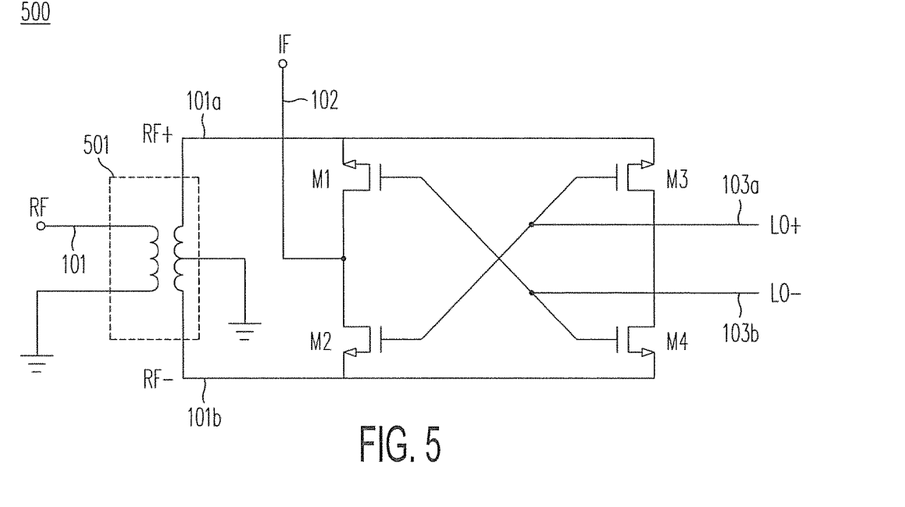
FIG. 5 illustrates double-balanced FET mixer 500 with a direct IF output signal at terminal 102, in accordance with one embodiment of the present invention.

FIG. 5 shows double-balanced FET mixer 500 with a direct IF output signal at IF port or terminal 102, in accordance with one embodiment of the present invention. As shown in FIG. 5, FETs M1 and M2 are primary switching FETs controlled by the differential signal LO (i.e., component signals LO+ and LO−) across terminals 103a and 103b.

When double-balanced FET mixer 500 is used as a frequency down-converting mixer, input signal RF on RF port 101 is applied and output signal IF at IF port 102 is realized. Balun 501 converts the single-ended input RF signal at RF port 101 to provide differential signal RF (i.e., signals RF+ and RF−) across terminals 101a and 101b. The differential side of balun 501 may include a center tap that may be connected to a ground reference, as shown. When differential signal LO is positive (i.e., signal LO+ is at high and signal LO− is at low), FET M2 is turned on, while FET M1 is turned off. Output signal IF at the IF port 102 has a value that equals the logic product of signal RF− and signal LO+.

When differential signal LO is negative (i.e., signal LO+ is at logic low and LO− is at logic high), FET M1 is turned on, while FET M2 is turned off. Output signal IF at IF port 102 has a value that is equivalent to the logic product of signal RF+ and signal LO−. Because the product signal RF− and signal LO+ and the product of signal RF+ and signal LO− are in the same phase, IF signal is the in-phase sum of the signals through FETs M1 and M2.

In FIG. 5, FETs M3 and M4 are secondary mixing FETs that further improve double-balanced FET mixer 500's overall performance by reducing the change in capacitance across terminals 101a and 101b when the FETs are switching. Also, signals LO+ and LO− signals on the gate terminals of FETs M3 and M4 couple to terminals 101a and 101b and act to cancel the LO+ and LO− signals coupled from FETs M1 and M2, thus reducing signal leakage from the local oscillator to the RF port 101 and IF port 102.

Parameters defining a double-balanced FET mixer 500's performance may include conversion gain (Gc), input third-order intercept point (IIP3), and noise figure (NF). Conversion gain Gc may be represented by a ratio of the power of the desired IF output signal to the power of the RF input signal. IIP3 may be taken as the point at which the extrapolated power of the third-order intermodulation tone intersects the power of the extrapolated fundamental tone. IIP3 quantifies the non-linearity of the double-balanced FET mixer. NF measures degradation of the signal-to-noise ratio (SNR) caused by the components of the RF signal chain.

Figure 6:
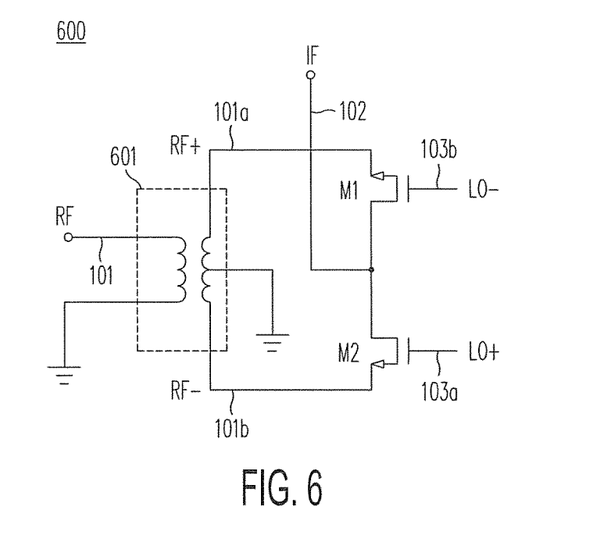
FIG. 6 shows FET mixer 600, which is a simplified version of double-balanced FET mixer 500 of FIG. 5, in accordance with one embodiment of the present invention.

FIG. 6 shows FET mixer 600, which is a simplified version of double-balanced FET mixer 500 of FIG. 5, in accordance with one embodiment of the present invention. As shown in FIG. 6, FET mixer 600 does not include FETs M3 and M4 of double-balanced FET mixer 500, as FETs M1 and M2 are sufficient to perform the frequency mixing function. Note that differential LO and RF signals across terminals 103a and 103b and terminals 101a and 101b, respectively, may have a leakage that is higher than the leakages in double-balanced FET mixers 100 and 200 of FIGS. 1 and 2. Signals LO+ and LO−, provided on terminals 103a and 103b, may couple to signals RF+ and RF− on terminals 102a and 102b, respectively, which may in turn couple to single-ended RF signal on terminal 101 through input RF balun 601. In double-balanced FET mixer 500, FETs M3 and M4 couple signals LO+ and LO− to signal RF+ through transistors M1 and M3, and couple signals LO+ and LO− to signal RF− through FETs M2 and M4. Since signals LO+ and LO− may cancel each other, differential signal LO to differential signal RF leakage is significantly reduced, so that double-balanced FET mixer 500 of FIG. 5 performs substantially equally to double-balanced FET mixers 100 and 200 of FIGS. 1 and 2.

In double-balanced FET mixer 500, the single-ended IF signal on IF port 102 may be connected directly to the mixer core (i.e., to FETs M1 and M2), without requiring an IF balun (also known as an IF transformer), as provided, for example, in double-balanced FET mixer 200 of FIG. 2. Thus, the IF port 102 may operate at frequencies down to DC.

Figure 7:
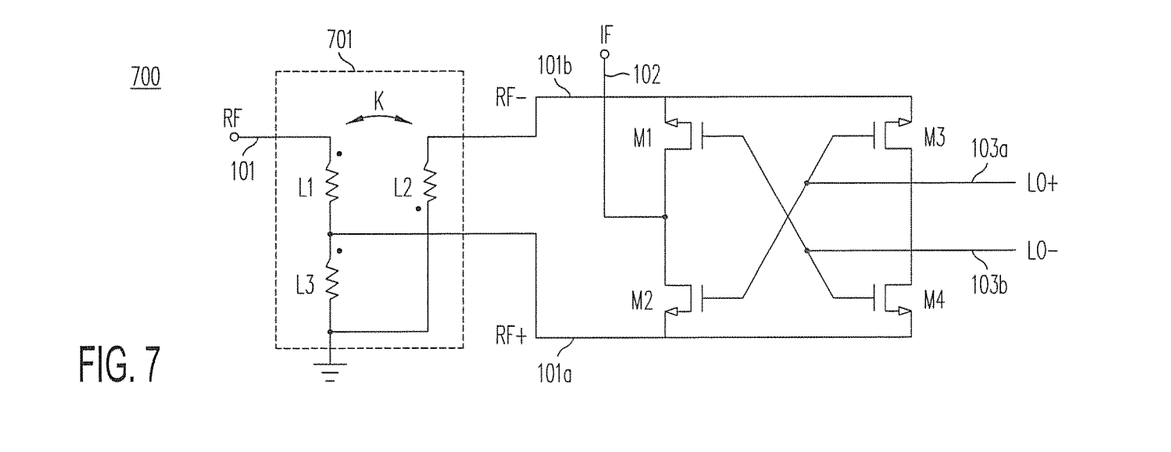
FIG. 7 shows double-balanced FET mixer 700 having wideband balun 701 for coupling the input single-ended RF signal, in accordance with one embodiment of the present invention.

FIG. 7 shows double-balanced FET mixer 700 having wideband balun 701 for coupling the input single-ended RF signal, in accordance with one embodiment of the present invention. As shown in FIG. 7, wideband balun 701 may include inductors L1, L2 and L3 to provide a much wider bandwidth than a conventional balun (e.g., balun 501 of double-balanced FET mixer 500 of FIG. 5). Use of wide bandwidth baluns is taught, for example, in U.S. Pat. No. 9,312,815, entitled "BROADBAND INTEGRATED RF/MICROWAVE/MILLIMETER MIXER WITH INTEGRATED BALUN(S)."

Figure 8:
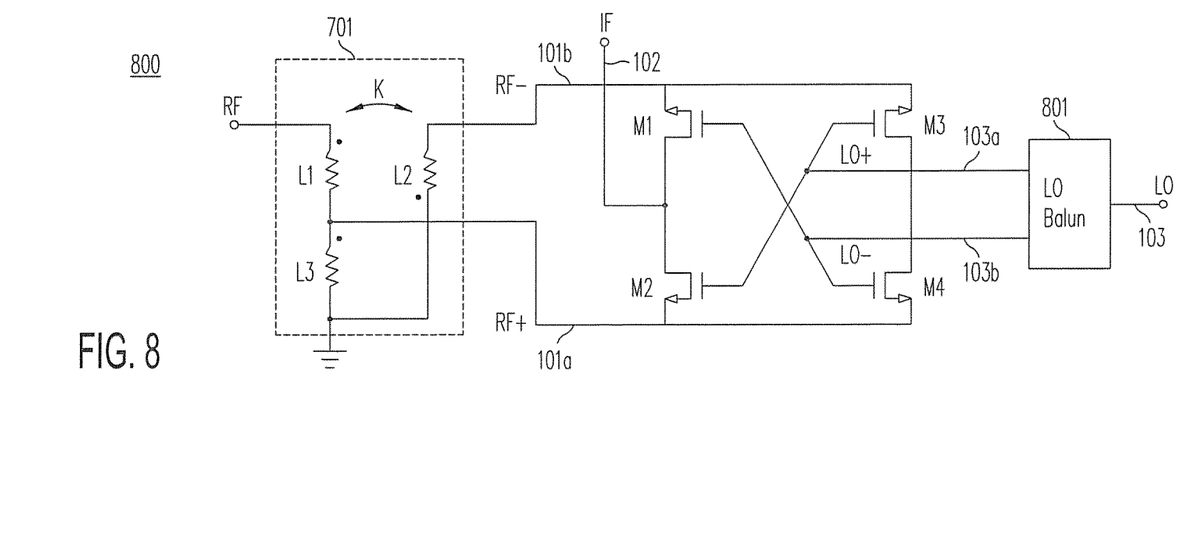
FIG. 8 shows double-balanced FET mixer 800, which receives single-ended signal LO at terminal 103, in accordance with one embodiment of the present invention.

FIG. 8 shows double-balanced FET mixer 800, which receives single-ended signal LO at terminal 103, in accordance with one embodiment of the present invention. Double-balanced FET mixer 800 differs from double-balanced FET mixer 700 by including balun 801, which may be an active balun or a passive balun. Balun 801 converts single-ended signal LO to a differential signal (signals LO+ and LO− across terminals 103a and 103b).

Figure 9:
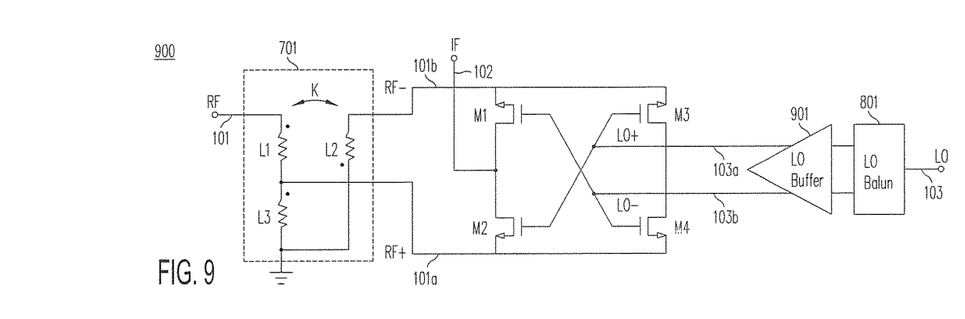
FIG. 9 shows double-balanced FET mixer 900 which includes amplifier or buffer 901, in accordance with one embodiment of the present invention.

FIG. 9 shows double-balanced FET mixer 900 which includes amplifier or buffer 901, in accordance with one embodiment of the present invention. Double-balanced FET mixer 900 differs from double-balanced FET mixer 800 of FIG. 8 by including amplifier 901, which drives FETs M1 to M4 of double-balanced FET mixer 900 to enhance performance at low signal levels of input signal LO.

Figure 10:
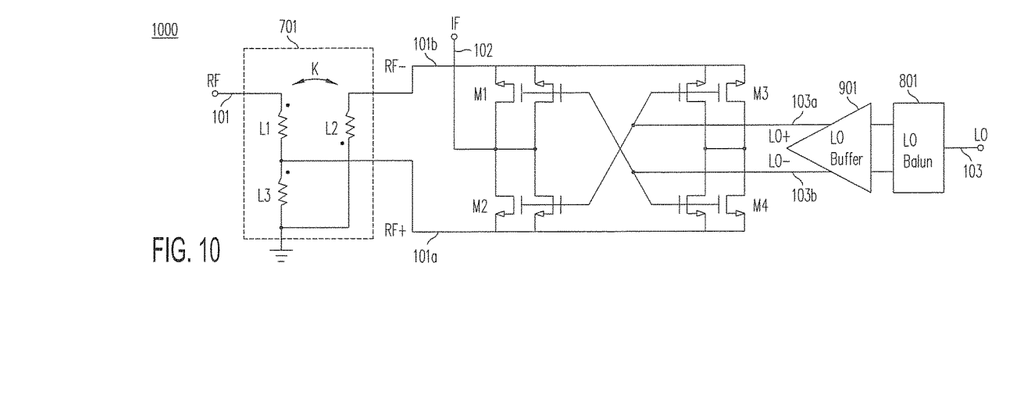
FIG. 10 shows double-balanced FET mixer 1000, in which FETs M1 to M4 of double-balanced FET mixer 900 of FIG. 9 are each implemented by multiple FETs connected in parallel, in accordance with one embodiment of the present invention.

FIG. 10 shows double-balanced FET mixer 1000, in which FETs M1 to M4 of double-balanced FET mixer 900 of FIG. 9 are each implemented by multiple FETs connected in parallel, in accordance with one embodiment of the present invention. As shown in FIG. 10, switching FETs M1, M2, M3 and M4 may each be realized by two or more FETs connected in a shunt connection. The number of FETs that are connected in parallel to implement each of FETs M1 and M2 may be different from the number of FETs connected in parallel to implement each of FETs M3 and M4. The implementation of FIG. 10 may optimize performance at certain frequency points.

Figure 11:
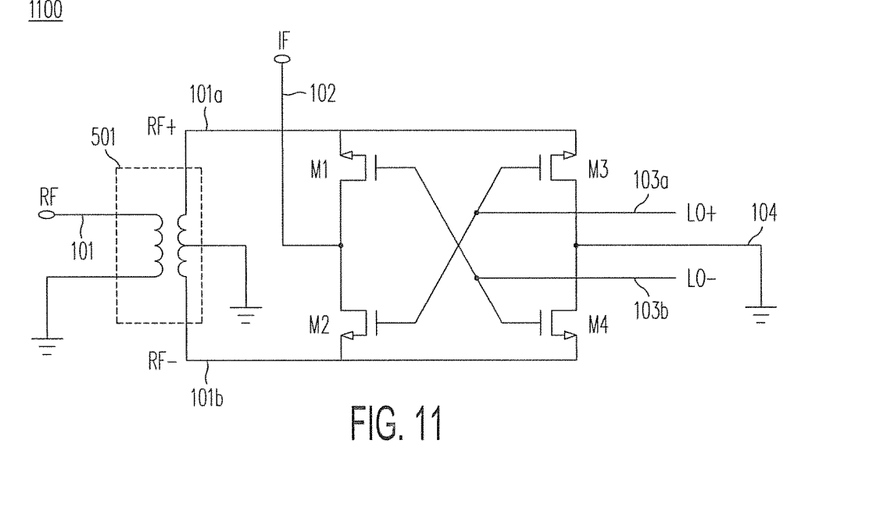
FIG. 11 shows double balanced FET mixer 1100, which provides single-ended signal IF at IF port 102, in accordance with one embodiment of the present invention.

FIG. 11 shows double balanced FET mixer 1100, which provides single-ended signal IF at IF port 102, in accordance with one embodiment of the present invention. Double-balanced FET mixer 1100 differs from double-balanced FET mixer 500 of FIG. 5 by connecting the drain terminals of FETs M3 and M4 to a ground reference, rather than leaving these drain terminals floating.

Figure 12:
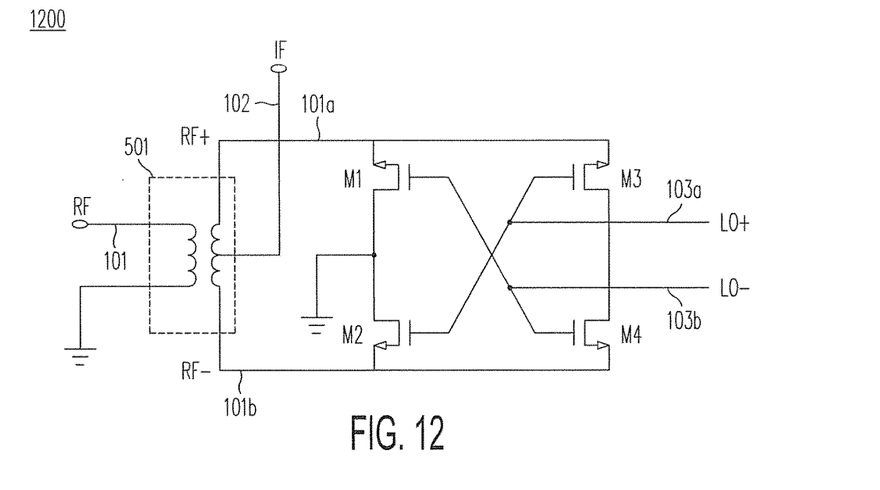
FIG. 12 shows double balanced FET mixer 1200, which provides single-ended signal IF at IF port 102, in accordance with one embodiment of the present invention.

FIG. 12 shows double balanced FET mixer 1200, which provides single-ended signal IF at IF port 102, in accordance with one embodiment of the present invention. In double-balanced FET mixer 1200, IF port 102 is provided directly from a center-tap of a secondary winding in RF balun 501. The center tap of the secondary winding may also serve as a virtual ground for the differential RF signal across terminals 101a and 101b. As shown in FIG. 12, an IF balun may not be required to allow achieving IF operations down to DC.

Figure 13:
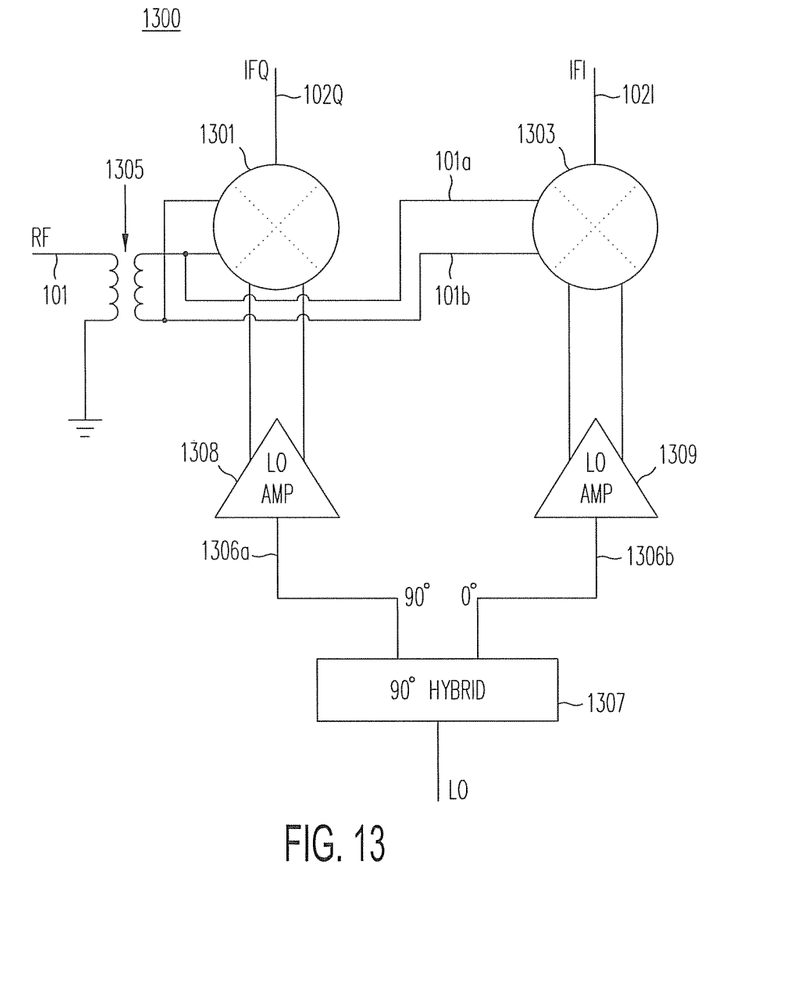
FIG. 13 shows mixer 1300 which may serve as an IQ mixer, an image reject mixer, or a single sideband (SSB) mixer, in accordance with one embodiment of the present invention.

Any of the mixer topologies illustrated in FIGS. 5-12 may be used in other frequency mixing applications, such as a triple-balanced mixer, an IQ mixer, an image reject mixer, or a single-side band (SSB) mixer. For example, FIG. 13 shows mixer 1300 which may serve as an IQ mixer, an image reject mixer, or a SSB mixer, in accordance with one embodiment of the present invention. In FIG. 13, mixers 1301 and 1303 may each be implemented using any of the double-balanced FET mixers of FIGS. 5-12. Single-ended local oscillator signal LO is converted by 90° hybrid circuit 1307 into differential local oscillator signals 1306a and 1306b that are 90° separated in phase from each other and each of which may then be amplified LO amplifiers 1308 and 1309, respectively, for input into mixers 1301 and 1302. RF balun 1305 converts a single-ended RF signal into a differential RF signal for input into mixers 1301 and 1302. Mixers 1301 and 1303 provide IF signals 102Q and 102I at IFQ and IFI ports. Signals 102I and 102Q are the quadrature and in-phase IF signals, respectively.

Figure 14:
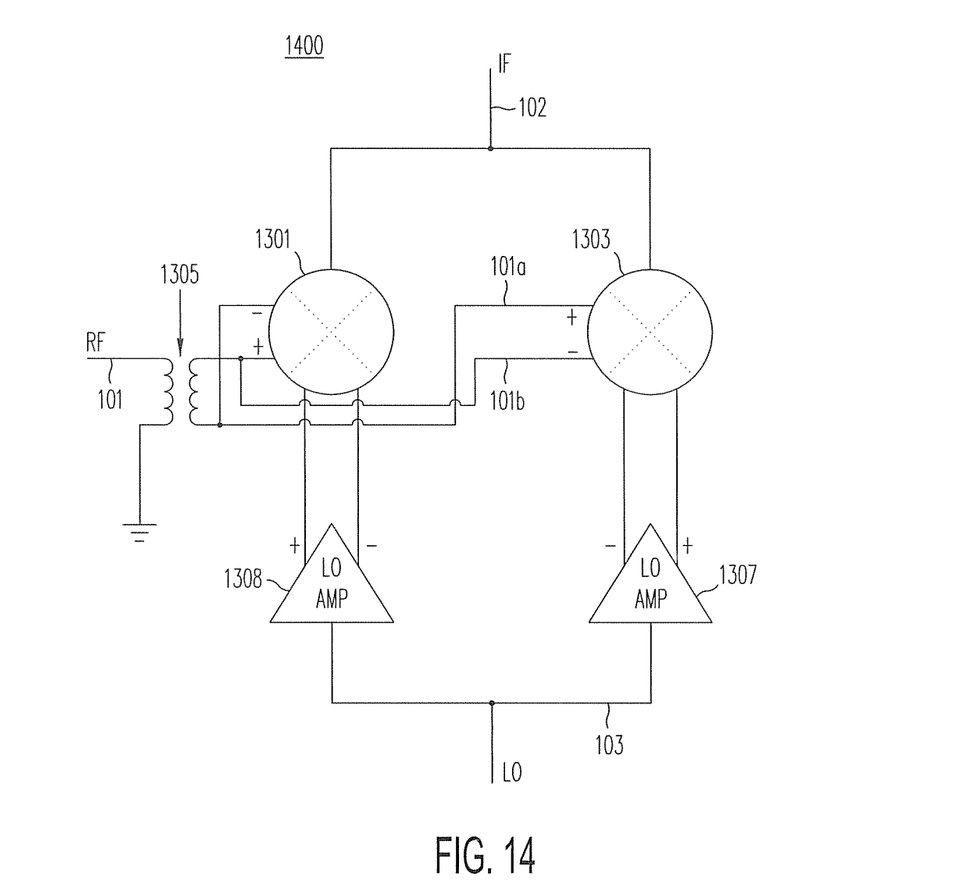
FIG. 14 shows triple balance FET mixer 1400, which includes mixers 1301 and 1303, in accordance with one embodiment of the present invention.

FIG. 14 shows triple balance FET mixer 1400, which includes mixers 1301 and 1303, in accordance with one embodiment of the present invention. As in mixer 1300, each of mixers 1301 and 1303 may be implemented by any of the mixers of FIGS. 5-12. Differential signal LO at LO port 103 is provided to mixers 1301 and 1303 to provide common output signal IF at IF port 102.

The components, steps, features, objects, benefits, and advantages that have been discussed are merely illustrative. None of them, nor the discussions relating to them, is intended to limit the scope of protection in any way. Numerous other embodiments are also contemplated. These embodiments include embodiments that have components, steps, features, objects, benefits, or advantages. These embodiments also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

We claim:

1. A double-balanced FET mixer comprising:
   a single-ended RF port that receives or delivers a single-ended RF signal;
   an RF balun that converts the received single-ended RF signal into a differential RF signal or that generates the delivered single-ended RF signal from a received differential RF signal;
   a local oscillator input port that receives a local oscillator signal;
   an IF port that receives or delivers a single-ended IF signal; and
   a passive mixer core comprising at least two field-effect transistors that process the local oscillator signal and that generate or process the differential RF signal and the single-ended IF signal.

2. The double-balanced FET mixer of claim 1, wherein the delivered RF signal has a frequency that is the frequency of the IF signal plus or minus the local oscillator signal.

3. The double-balanced FET mixer of claim 1, wherein the IF signal has a frequency that is the frequency of the received RF signal plus or minus a frequency of the local oscillator signal.

4. The double-balanced FET mixer of claim 1, wherein the single-ended IF signal has DC frequency.

5. The double-balanced FET mixer of claim 1, wherein two of the field-effect transistors have source terminals coupled to the RE balun, so as to receive the differential RF signal.

6. The double-balanced FET mixer of claim 1, wherein the local oscillator signal comprises a differential signal, and wherein the differential signal is provided across the gate terminals of two of the field-effect transistors.

7. The double-balanced FET mixer of claim 1, wherein the IF port is taken directly connected from a common node connecting drain terminals of two of the field-effect transistors without an intervening balun.

8. The double-balanced FET mixer of claim 1, wherein the RF balun comprises a wideband RF balun.

9. The double-balanced FET mixer of claim 1, wherein the local oscillator signal comprises a single-ended signal and wherein the double-balanced FET mixer further comprises a local oscillator balun connected to the single-ended signal to provide a differential LO signal.

10. The double-balanced FET mixer of claim 9, further comprising a buffer which amplifies the differential LO signal.

11. The double-balanced FET mixer of claim 1, wherein the drain terminals of two of the field-effect transistors are connected to a ground reference.

12. The double-balanced FET mixer of claim 1, wherein one or more of the field-effect transistors are each implemented by two or more MOS transistors with common source, drain and gate terminals.

13. The double-balanced FET mixer of claim 1, wherein the double-balanced FET mixer implements one of the mixers in a triple-balanced mixer.

14. The double-balanced FET mixer of claim 1, wherein the double-balanced FET mixer implements one of the mixers in an IQ mixer, an image reject mixer or a single side band mixer.

15. The double-balanced FET mixer of claim 14, further comprises a hybrid generating quadrature signals for the mixers of the IQ mixer.

* * * * *